United States Patent [19]

Erskine

[11] 4,385,719

[45] May 31, 1983

[54] MACHINE FOR INSERTING SPRING PINS

[75] Inventor: Paul Erskine, Edgecomb, Me.

[73] Assignee: Mechanical Applications, Inc., Wiscasset, Me.

[21] Appl. No.: 254,994

[22] Filed: Apr. 16, 1981

[51] Int. Cl.³ .................... H05K 13/04; B21J 15/32; B33B 49/00

[52] U.S. Cl. .................................... 227/116; 29/739; 227/138

[58] Field of Search .................. 29/739; 227/114, 115, 227/116, 101, 138, 142

[56] References Cited

U.S. PATENT DOCUMENTS

| | | | |
|---|---|---|---|
| 2,285,384 | 6/1942 | Schott | 227/142 X |
| 3,565,315 | 3/1971 | Bixler | 227/116 |
| 3,788,537 | 1/1974 | Fox | 227/142 |
| 3,982,679 | 9/1976 | White, Jr. | 227/116 |
| 4,265,013 | 5/1981 | Brown et al. | 227/116 X |
| 4,333,233 | 6/1982 | Dodson et al. | 29/739 X |
| 4,351,467 | 9/1982 | White | 227/142 |

Primary Examiner—Paul A. Bell
Attorney, Agent, or Firm—C. Yardley Chittick

[57] ABSTRACT

A machine for driving a spring pin or other similar cylindrical object into a hole in a work piece. One pin at a time is automatically fed into a shuttle. The shuttle is moved laterally to bring the pin into alignment with a pin inserting punch. Upon subsequent movement of the punch, the shuttle with the pin therein is moved downwardly until the work piece therebelow is engaged. The punch continues its downward movement, entering the shuttle and driving the pin into the aligned hole in the work piece. The downward moveability of the shuttle enables pins to be driven into work pieces whose upper surfaces may be a different vertical levels. Adjustable means controlling the stroke of the punch limits the depth of insertion of the pin into the work piece.

5 Claims, 10 Drawing Figures

MACHINE FOR INSERTING SPRING PINS

BACKGROUND OF THE INVENTION

The use of spring pins is extensive. A spring pin is a small cylinder (usually of metal) of selected length and diameter, slit longitudinally so that it may be compressed circumferentially sufficiently to enable it to be driven into a slightly smaller cylindrical hole in a work piece.

Because spring pins are usually small and difficult to manipulate by hand, it has been found expedient to drive the pins into the holes through the use of specially designed tools such as the Hand-Loaded Pin Chuck shown in U.S. Pat. No. 3,788,537 and the Machine for Driving Spring Pins shown in U.S. Pat. No. 3,982,679.

SUMMARY OF THE INVENTION

The machine of the present invention enables spring pins or other similar cylindrical objects to be inserted automatically one at a time in holes in work pieces supported on the machine.

The pins all of the same length and diameter are supplied to the machine in vertical alignment to be fed one at a time into a pin receiving shuttle which is moved in timed relation with a pin punch horizontally from pin receiving position to a second position directly under a pin driving means in the form of a downwardly moving punch.

The shuttle then commences to move downward from said second position with the punch following. The downward movement of the shuttle continues until the nose on the underside of the shuttle engages the work piece directly above the hole into which the pin is to be inserted. The punch continues its downward movement to drive the pin from the shuttle into the hole to a predetermined depth.

The punch is then retracted and the now empty shuttle is raised to the level at which it may be moved horizontally. The shuttle, clear of the punch, is then moved laterally to original pin receiving position to receive therein the next pin from the pin supply means. The operation is then repeated to insert this next pin in another hole in a work piece which has in the meanwhile been placed in alignment with the punch.

The machine can accommodate pins of varying diameters and length by simple adjustments and substitutions of a few parts.

The invention will be better understood by reference to the following detailed description aided by the accompanying drawings.

BRIEF DESCRIPTION OF THE DRAWINGS

FIG. 6 is a vertical section taken on the line 6—6 of FIG. 1.

FIG. 7 is a vertical section taken on the line 7—7 of FIG. 1.

FIG. 8 is a vertical section taken on the line 8—8 of FIG. 7.

DESCRIPTION OF A PREFERRED EMBODIMENT

Figure 1:
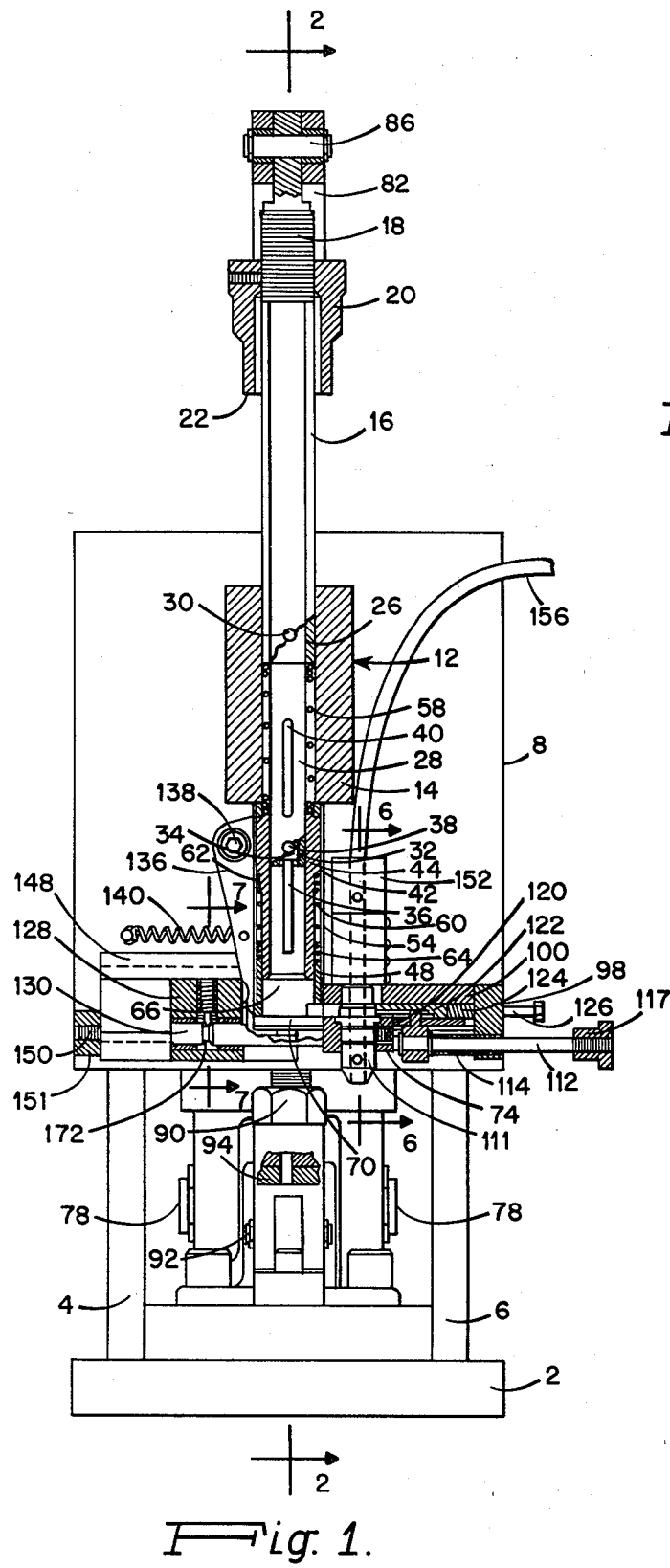
FIG. 1 is a front elevation of the machine with much of the pin inserting means in vertical section.
Figure 2:
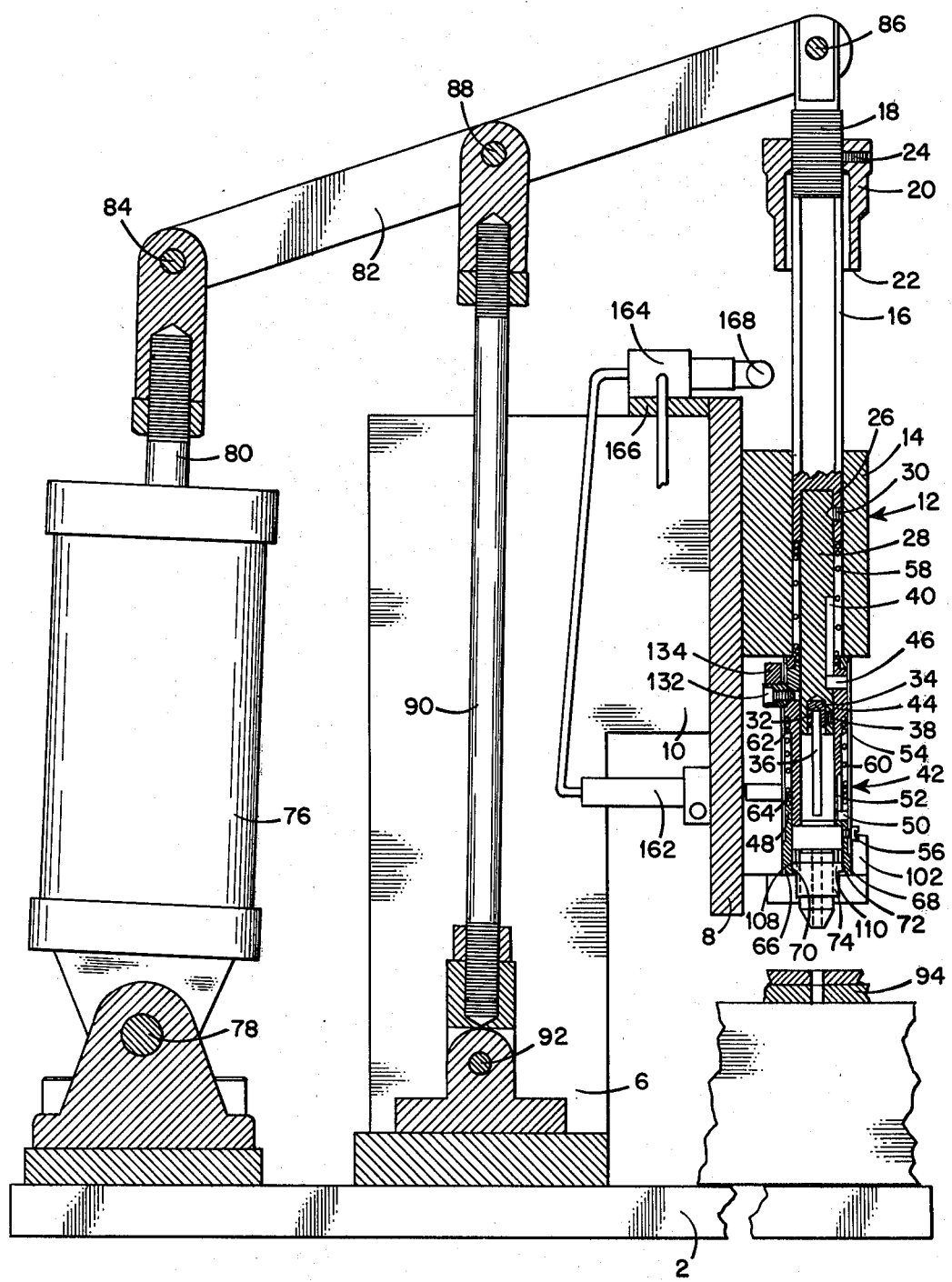
FIG. 2 is a vertical section of the machine taken on the line 2—2 of FIG. 1.

Referring first to FIGS. 1 and 2, the machine comprises a base 2 heavy and strong enough to carry all of the supporting structure and operating parts and the work pieces into which the pins are to be inserted with proper rigidity and alignment.

It will be understood that when it is stated hereinafter that various members are secured together it means they have been immoveably connected by any conventional fastening means, such as bolts, screws, rivets welding or otherwise even though such connecting means are not shown in the drawings.

Spaced strong vertical side plates 4 and 6 are mounted on base 2. A vertical chassis plate 8 is mounted on the forward overhangs 10 of plates 4 and 6.

On the front face of chassis plate 8 is mounted the pin inserting unit generally referred to at 12. This unit comprises a guide 14 secured to plate 8 in which is positioned a vertically slidable ram 16. The ram and guide are generally square in cross section so that rotation of the ram is prevented.

The upper end of ram 16 is threaded at 18 on which is screwed adjusting nut 20, the lower end of which as at 22 makes engagement with the top of guide 14 to limit downward stroke of ram 16. A set screw 24 is used to hold nut 20 in any selected adjusted position.

The lower end of ram 16 is drilled at 26 to receive the upper end of a cylindrical punch holder 28 secured by set screw 30. The lower end of holder 28 is drilled at 32 to receive the upper end 34 of a punch 36 secured by set screw 38. Punches of varying diameters within limits may be mounted in holder 28. Holder 28 has a longitudinal slot 40 therein whose purpose will shortly be explained.

The structure of the ram, holder and punch is in effect one piece and the extent of the downward movement of punch 36 is limited by the setting of adjustment nut 20. The tolerances of the guide 14 and ram 16 are close so that punch 36 travels in an accurate straight line path.

Associated with holder 28 is a shuttle carrying unit generally referred to at 42. This unit consists of three parts: a cylindrical sleeve 44 slidably mounted on the lower end of holder 28 and secured from removal by pin 46, the inner end of which is free to slide in slot 40; a second cylindrical sleeve 48 which is in telescoped relation with the reduced diameter lower part of sleeve 44 and locked against removal therefrom by a pin 50 slidable in a longitudinal slot 52 in the lower part of sleeve 44; and thirdly, a cylindrical casing 54 which is secured to sleeve 48 by screw 56.

As viewed in FIG. 2, there is shown a pin 132 screwed into the rear wall of sleeve 44. This pin 132 resides in a vertical slot in casing 54. Thus sliding movement of sleeve 44 within casing 54 is not affected by the presence of pin 132 whose function will be later explained.

As can be best seen in FIG. 2, upward movement of sleeve 48 attached to casing 54 by screw 56 is limited by engagement of the top of casing 54 with the bottom of guide 14. Upward movement of sleeve 44 with respect to sleeve 48 is limited by engagement of the lower end of slot 52 with pin 50. Upward movement of the unit comprising the punch 36, punch holder 28 and ram 16 is limited by engagement of the lower end of slot 40 with pin 46 which is fixed to sleeve 44.

Thus the heretofore described parts as viewed in FIG. 2 are all at the upper limits of their possible movement with respect to guide 14.

It will also be noticed that there are two helical springs associated with the aforedescribed mechanism. Spring 58 is a compression spring constantly urging sleeve 44 downward with respect to holder 28 but subject to compression under circumstances to be described.

Spring 60 is a helical spring in tension being attached to sleeve 44 at 62 and attached to sleeve 48 at 64. The purpose of spring 60 is to insure more telescoping of the sleeves when conditions permit.

The part of sleeve 48 that is below the end casing 54 is not circular. Instead it takes the form of two spaced parallel walls 66 and 68 parallel to chassis plate 8. The walls have horizontal grooves therein 70 and 72 which form tracks to receive and support the side flanges 108 and 110 of shuttle 74.

The ram 16 and all of the punch related mechanism is moved by any suitable power means downward to drive a pin carried by shuttle 74 into a work piece 94 and then to retract upward to the original position.

The power means shown herein comprises an air cylinder 76 pivotally mounted at 78 on base 2. A lever 82 pivotally connected to piston 80 at 84 and to ram 16 at 86 has its fulcrum at 88 which is supported by rod 90 pivotally mounted at 92 on base 2. It is believed obvious that reciprocating motion of piston 80 will result in corresponding straight line movement of ram 16 and the associated pin inserting mechanism.

Figure 3:
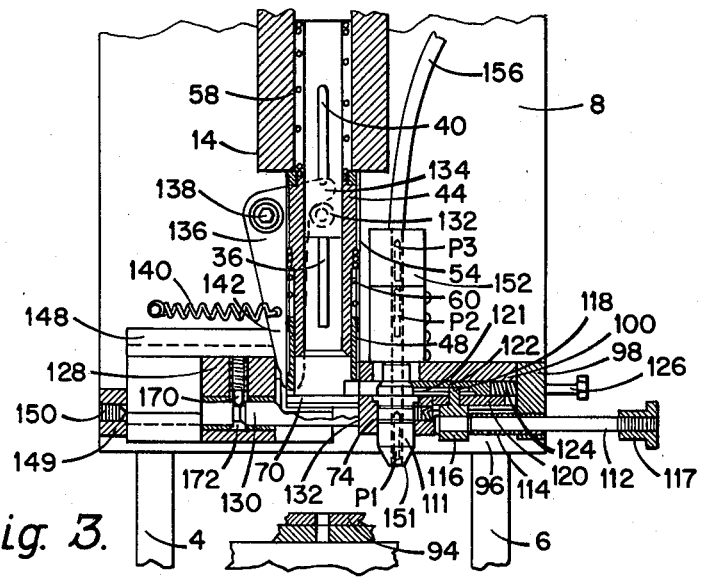
FIGS. 3, 4 and 5 are fragmentary vertical sectional views based on FIG. 1 showing the successive positions of the pin carrying shuttle and the punch as the shuttle moves from pin receiving position to engagement with the work piece.
Figure 4:
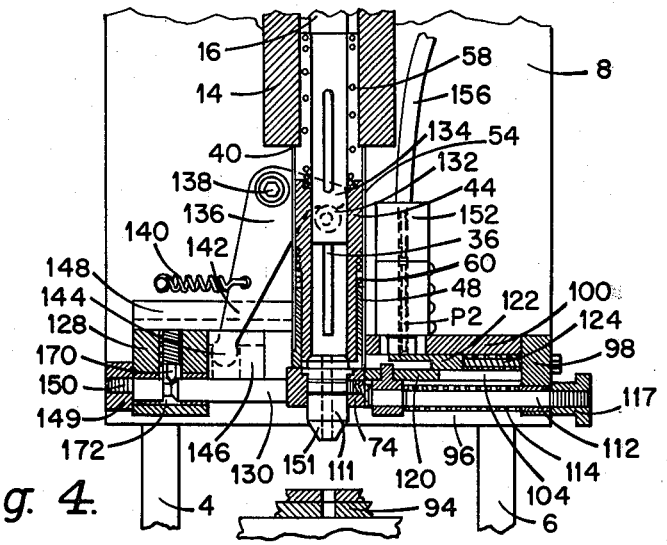
Figure 5:
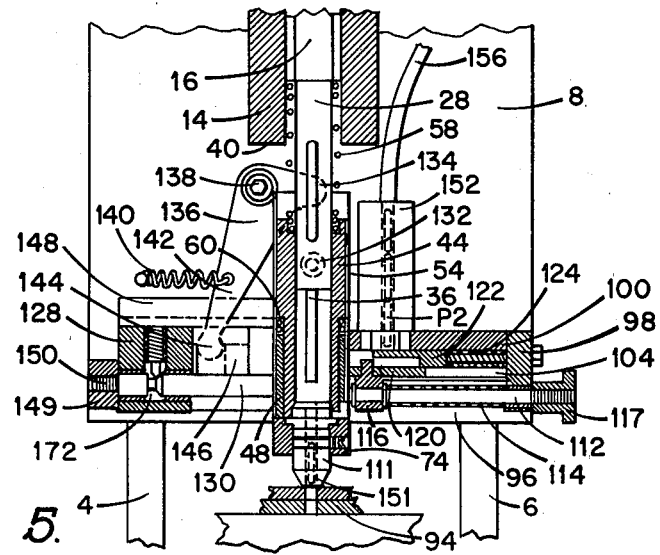

Attention is now called to FIGS. 3, 4 and 5 which illustrate the successive position of shuttle 74. In FIG. 3, the shuttle is in pin receiving position. In FIG. 4, the shuttle has been moved to the left simultaneously with the commencement of downward movement of punch 36 and is aligned with punch 36.

In FIG. 5, the shuttle has been moved downward along with continuing movement of the punch until the nose of the shuttle engages the work piece 94. This brings the shuttle to a halt with the pin therein aligned with the hole in the work piece. Downward movement of the punch 36 continues, entering the pin carrying unit in the shuttle and driving the pin into the work piece to the required depth as controlled by the setting of adjusting nut 20.

The movement of piston 80 in air cylinder 76 is then reversed and the punch 36, shuttle 74 and related parts are moved up first to the position shown in FIG. 4 and finally to the position shown in FIG. 3 at which point the cycle is terminated.

The means for loading the shuttle with a pin, transferring the shuttle laterally to a position under the punch as in FIG. 4 and then moving it downwardly to engage the work piece in position to receive the punch as in FIG. 5 will now be explained.

Referring to FIGS. 3, 4, 5 and 6 there is mounted on the face of chassis plate 8 any suitable supporting framework to provide a space in which may be mounted the shuttle and other cooperating elements. As shown there is a back plate 96, end plate 98, cover plate 100 and face plate 102 (removed in FIGS. 3, 4 and 5). Plates 96 and 102 have facing parallel grooves 104 and 106 adapted to receive in sliding relation the flanges 108 and 110 on opposite sides of shuttle 74 (see FIG. 6).

The shuttle 74 is considered as a unitary article but it has extending vertically therethrough a special removable pin receiving element 111 (circular in cross section) which as part of the shuttle carries the pin to insertion position in the work piece 94.

Referring again to FIG. 3, a rod 112 slidable in end plate 98 has its left end in engagement with the right side of shuttle 74. A compressed coil spring 114 between wall 98 and block 116 axially secured to rod 112 forces rod 112 against shuttle 74 urging its movement to the left. The stroke of rod 112 is limited by an adjustable nut 117 on the end.

A short stud 118 on block 116 is engaged with a freely moveable plate 120 which also presses to the left against the upper part of the shuttle.

The upper end of stud 118 resides in a longitudinal slot 121 in the underside of still another laterally slideable plate 122 which is constantly urged to the left by a spring 124 encircling a headed adjusting screw 126 which is screwed into the end of plate 122. Movement of plate 122 to the left in FIG. 3 is prevented by its engagement with the top part of pin receiving element 111 and engagement of the end of slot 121 with stud 118.

As long as the machine is inoperative with the ram and punch at the top of the stroke as shown in FIGS. 1, 2 and 3 the shuttle and other parts just described are maintained in the position shown in FIGS. 1 and 3 by the opposing force of a transfer pin 130 mounted on a slide 128 to engage the left side of shuttle 74.

Upon the start of a pin inserting cycle, the punch starts down and simultaneously slide 128 and pin 130 move to the left, allowing the springs 114 and 124 to move the shuttle and plates 120 and 122 to the left to the positions shown in FIG. 4.

The movement of slide 128 and its pin 130 is controlled as follows. Fixed on the rear of sleeve 44 (see FIG. 2) is pin 132. It cooperates with the short arm 134 of bell crank 136 pivoted at 138 on chassis plate 8. As the ram and punch start downward, moving from the position of FIG. 3 to that of FIG. 4, pin 132 moves away from arm 134 allowing a tension spring 140 to swing the long arm 142 of the bell crank clockwise. The end 144 of arm 142 is located in a socket of slide carrier 146 which moves from right to left traveling in the track 148 mounted on the face of chassis 8. Movement of slide 128 is accurately limited by adjusting screw 150 mounted in arm 149 so that when transfer pin 130 comes to a stop the shuttle and pin holder 111 will be in aligned position with punch 36 and the bottom cylindrical end of sleeve 44.

It will be noted in FIG. 4 that although punch 36 has been steadily moving down there has been no downward movement of casing 54 which carries the track 70, 72 (see FIG. 2) into which the shuttle has been moved from its original FIG. 3 position. Sleeve 44 carrying pin 132 has telescoped more into sleeve 48 pulled by tension spring 60 and pushed by compression spring 58. Pin 132 resides in a longitudinal slot in casing 54.

However, downward movement of shuttle 74, casing 54 and the contained sleeves 44 and 48 begins as soon as the shuttle is aligned with punch 36 as in FIG. 4. This movement continues until as shown in FIG. 5, the nose 151 of pin holder 111 engages the work piece 94. Then movement of everything stops except the ram 16 and punch 36. Holder 28 moves down within sleeve 44 with spring 58 being compressed to force the bottom end of sleeve 44 firmly against pin holder 111. The punch 36 enters pin holder 111 to drive the pin therein into the work piece 94 to the depth required as controlled by stop 20 engaging the top of guide 14.

Movement of piston 80 is automatically reversed and the ram, punch and related parts move up to the positions shown in FIG. 4. Casing 54 has engaged the bottom of guide 14 so that shuttle 74 is at a level where it may be moved laterally to its original position shown in FIG. 3.

Sleeve 44 is then pulled up from its telescoped position of FIG. 4 to the position of FIG. 2 by the engagement of pin 46 with the bottom end of slot 40 in holder 28. As this last movement occurs, pin 132 attached to sleeve 44 engages arm 134 of bell crank 136 to swing arm 142 counterclockwise to move slide 128 and transfer pin 130 to the right to push shuttle 74 to the position of FIG. 3 and in so doing overcoming the pressures of springs 14 and 124.

Shuttle 74 is maintained in the position of FIGS. 1 and 3 so long as the ram 16 remains stationary at the top of its stroke with pin 132 compelling bell crank 136 to be as shown in FIG. 3.

At this point the operating cycle of the punch and shuttle is ended.

DESCRIPTION OF MEANS FOR LOADING PIN HOLDER

Figure 9:
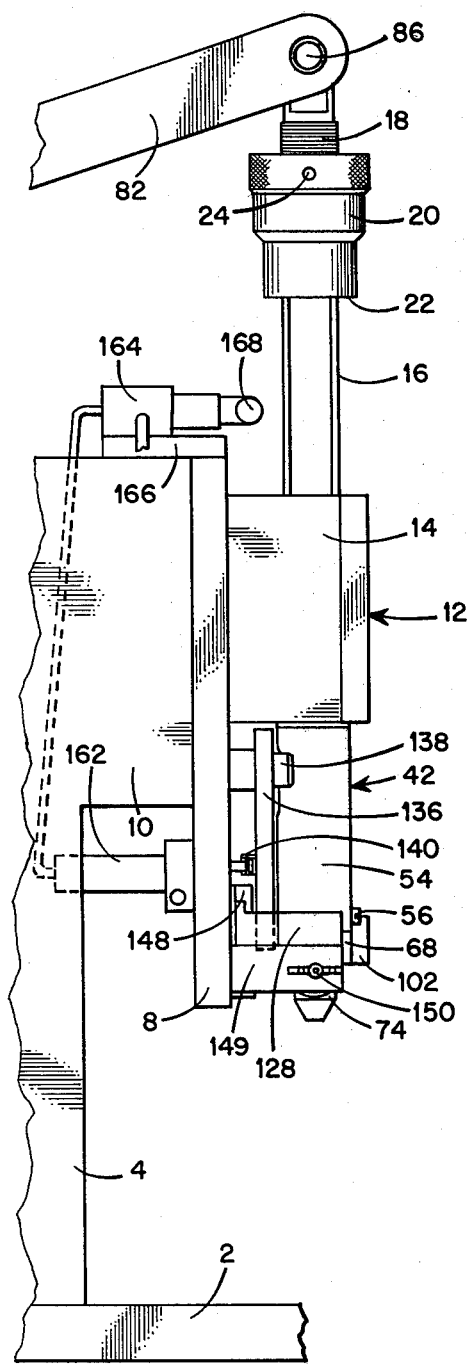
FIG. 9 is a fragmentary side elevation of the pin inserting part of the machine with the ram in up position.
Figure 10:
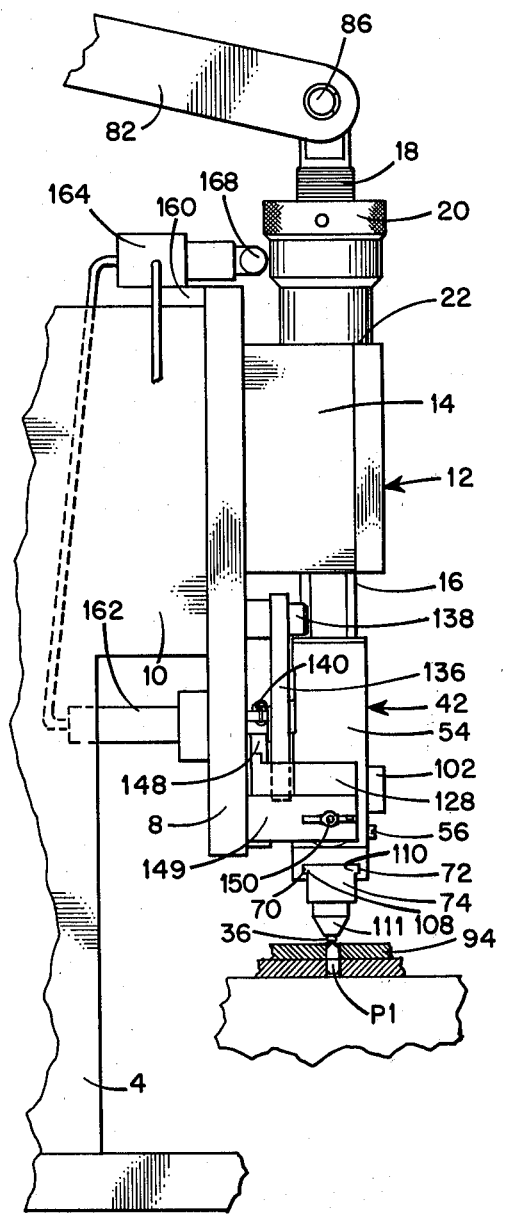
FIG. 10 is a fragmentary side elevation similar to FIG. 9 with the ram at the end of its downward stroke.

Referring to FIGS. 1, 3, 4, 5 and 6, a pin feed unit 152 is mounted vertically on cover plate 100 and held by set screw 154. Unit 152 has leading thereto a pin supply pipe 156 through which a succession of pins of uniform length and diameter are automatically fed to feed unit 152. The mechanism for placing pins in pipe 156 is old and well understood in the art and need not be explained here. The pins, descending by gravity, are restrained by an escapement pin 158 extending horizontally through a selected hole 160 (see FIG. 6). Escapement pin 158 is connected to a piston in small air cylinder 162 mounted on the back side of chassis plate 8. A spring in cylinder 162 urges pin 158 to the right (as in FIG. 6) to engage and hold a pin P2 against downward movement while a compressed air supply controlled by air valve 164 mounted on a support 166 (see FIGS. 2 and 9) moves pin 158 to the left to free the restrained pin.

The object of this mechanism is to allow a single pin to drop into pin holder 111 when it returns empty to the position of FIG. 3. To get the procedure in operation, the machine is run through a first cycle with no pin in the pin holder 111. The first pin in the feed unit 152 will be held against descent by escapement pin 158. When shuttle 74 reaches the position of FIG. 4, the plate 122 will have moved to the left to block the lower end of the passage in unit 152. Then when the ram 16 approaches the bottom of its stroke, nut 20 (see FIGS. 2 and 9) will engage valve actuator 168 moving it to the left to open air valve 164 to admit air to cylinder 162 to withdraw pin 158 from its engagement with the pin P2 (see FIG. 6) so that P2 falls to rest on plate 122 (see FIGS. 4 and 5). Then when shuttle 74 returns to the position of FIGS. 3 and 6, shifting to the right of plate 122 permits pin P2 to fall into the pin holder 111 where it is referred to as pin P1.

In the meanwhile however, ascent of ram 16 has caused valve 164 to close and escapement pin 158 is spring pressed against the next pin P2 in the unit 152. The machine is now loaded and ready to insert the first pin. The next cycle is initiated, pin P1 in the shuttle is driven into the work piece, pin P2 drops first on to plate 122 and then into pin holder 11 at the end of the cycle. This process is repeated until the machine is shut down.

In order to protect against breakage should the shuttle in its lateral travel become stuck in its track or otherwise be incapable of movement to the right under the urging of transfer pin 130, it has been found desirable to provide means for releasing transfer pin 130 from slide 128. This is done by having pin 130 slidably supported in slide 128 and held in normal operative position by a spring loaded plunger 170 which resides in groove 172. If overloading occurs, pin 130 will dislodge plunger 170 and move to the left with respect to slide 128. When the malfunction has been corrected, pin 130 may be reset in slide 128.

The machine may be readily adjusted to handle pins of varying lengths and diameters whether they be spring pins or solid pins. The length of the pin determines into which of the several holes 160 the escapement pin 158 must be placed. Unit 152 may be replaced with other units with larger or smaller passages. Likewise the pin holder 111 may be changed at will to accommodate pins of different diameters. Each pin in pin holder 111 is temporarily held against falling therethrough by a small O-ring such as shown in the nose 151 in FIG. 6.

If means is provided for rapid shifting of the work piece so that a next pin receiving hole is placed in alignment with the punch within the cycle time of the machine, the machine could run continuously. Ordinarily however, the machine runs through a single cycle to be started by the operator when the next pin receiving hole is in correct alignment with the punch.

It is intended to cover all changes and modifications of the example of the invention herein chosen for purposes of the disclosure which do not constitute departures from the spirit and the scope of the invention.

I claim:

1. A machine for driving a pin into a hole in a work piece, comprising
    a shuttle including a passage therethrough for receiving and holding a pin,
    fixed means supporting said shuttle for lateral movement thereon,
    stationary means for placing a pin in said shuttle while supported by said fixed means,
    vertically moveable shuttle supporting means,
    means for moving said shuttle first laterally from said fixed means to said vertically moveable supporting means, and then downwardly while supported by said vertically moveable means to a position over a hole in said work piece,
    means for driving said pin from said shuttle into said work piece,
    and means for returning said shuttle to starting position on said fixed supporting means.

2. The machine set forth in claim 1,
    the means for driving said pin into said work piece comprising a reciprocating ram with a pin driving punch connected thereto.

3. The machine set forth in claim 2,
    means under the control of downward movement of said ram for moving said shuttle in one lateral direction and means driven by upward movement of said ram for moving said shuttle in the other lateral direction.

4. The machine set forth in claim 2,
said shuttle when under said punch and aligned therewith supported by means surrounding said punch which means are slidable axially with respect to said punch, whereby said shuttle on engaging said work piece may stop downward movement while said ram and punch continue downward movement to drive said pin from said shuttle into said work piece.

5. A machine for inserting a spring pin in a work piece, said machine comprising
a base on which a pin receiving work piece may be positioned,
a supporting structure on said base,
pin driving means in the form of a vertically moveable punch carried by said structure,
a shuttle having a vertical passage therethrough adapted to receive a pin,
fixed shuttle supporting means on said structure whereby said shuttle may be moved laterally from a pin receiving position to a position beneath and in alignment with said punch,
vertically moveable means for receiving and supporting said shuttle adjacent said fixed supporting means,
means for delivering a pin into said shuttle passage when said shuttle is at pin receiving position supported by said fixed supporting means and means for temporarily holding said pin in said passage,
means for moving said shuttle laterally from said pin receiving position on said fixed supporting means to said vertically moveable supporting means in which position said passage and pin therein are below and aligned with said punch and with a hole in a work piece supported therebelow on said base,
means for moving said moveable supporting means and said shuttle downwardly to place the lower open end of the shuttle in engagement with said work piece and aligned with said hole therein,
means for moving said punch downwardly to enter said shuttle passage to engage the upper end of said pin therein and to force said pin downwardly from said passage into said aligned hole in said work piece,
means for moving said punch upwardly to its original up position,
means for moving said moveable shuttle supporting means and said shuttle upwardly to its original laterally moveable position,
means for moving said shuttle laterally from said moveable support to said fixed support to place said passage again in pin receiving position,
and means for delivering a next pin into said passage,
whereby the aforesaid operation may then be repeated to place said next pin into another aligned hole in a work piece.

* * * * *